US008030822B2

(12) United States Patent
Iwama

(10) Patent No.: US 8,030,822 B2
(45) Date of Patent: Oct. 4, 2011

(54) ULTRASONIC PROBE AND ULTRASONIC DIAGNOSTIC APPARATUS

(75) Inventor: Nobuyuki Iwama, Nasushiobara (JP)

(73) Assignees: Kabushiki Kaisha Toshiba, Tokyo (JP); Toshiba Medical Systems Corporation, Otawara-shi (JP)

( * ) Notice: Subject to any disclaimer, the term of this patent is extended or adjusted under 35 U.S.C. 154(b) by 954 days.

(21) Appl. No.: 11/554,417

(22) Filed: Oct. 30, 2006

(65) Prior Publication Data

US 2007/0106159 A1 May 10, 2007

(30) Foreign Application Priority Data

Oct. 31, 2005 (JP) ................................ 2005-317651

(51) Int. Cl.
*H01L 41/08* (2006.01)

(52) U.S. Cl. ...................................................... 310/317

(58) Field of Classification Search ............. 310/316.01, 310/31, 6.02, 317
See application file for complete search history.

(56) References Cited

U.S. PATENT DOCUMENTS

| | | | | |
|---|---|---|---|---|
| 3,371,233 | A * | 2/1968 | Cook | 310/317 |
| 4,096,756 | A * | 6/1978 | Alphonse | 73/609 |
| 4,276,491 | A * | 6/1981 | Daniel | 310/317 |
| 4,983,875 | A * | 1/1991 | Masaki et al. | 310/323.03 |
| 5,076,277 | A | 12/1991 | Iwama et al. | |
| 5,124,611 | A * | 6/1992 | Tamai et al. | 310/317 |
| 5,548,175 | A * | 8/1996 | Tamai | 310/323.12 |
| 5,877,579 | A * | 3/1999 | Zumeris | 310/323.01 |
| 5,955,819 | A * | 9/1999 | Takano et al. | 310/316.01 |
| 5,997,479 | A | 12/1999 | Savord et al. | |
| 6,806,623 | B2 | 10/2004 | Petersen et al. | |
| 7,075,211 | B1 * | 7/2006 | Ganor et al. | 310/317 |
| 2005/0029905 | A1 * | 2/2005 | Dal et al. | 310/317 |

FOREIGN PATENT DOCUMENTS

| | | |
|---|---|---|
| JP | 7-288891 | 10/1995 |
| JP | 2000-33087 | 2/2000 |
| JP | 2004-89694 | 3/2004 |

* cited by examiner

*Primary Examiner* — Mark Budd
(74) *Attorney, Agent, or Firm* — Oblon, Spivak, McClelland, Maier & Neustadt, L.L.P.

(57) ABSTRACT

An ultrasonic probe includes ultrasonic oscillators each having first and second electrodes, a first transmitting circuit that is connected to the first electrode to transmit an electrical signal to the ultrasonic oscillator, and a second transmitting circuit that is connected to the second electrode to transmit an electrical signal to the ultrasonic oscillator.

11 Claims, 7 Drawing Sheets

ULTRASONIC PROBE AND ULTRASONIC DIAGNOSTIC APPARATUS

CROSS-REFERENCE TO RELATED APPLICATIONS

This application is based upon and claims the benefit of priority from prior Japanese Patent Applications No. 2005-317651, filed Oct. 31, 2005, the entire contents of which are incorporated herein by reference.

BACKGROUND OF THE INVENTION

1. Field of the Invention

The present invention relates to an ultrasonic probe including a transmitting circuit mounted therein and an ultrasonic diagnostic apparatus.

2. Description of the Related Art

An ultrasonic probe including a 1.5 dimensional array or a two dimensional array having elements larger than the number of channels (for example, 128 channels) of an ultrasonic diagnostic apparatus main body has been developed.

In JP-A-2000-33087, an example that processes signals by dividing an ultrasonic oscillator into groups of a plurality of sub arrays.

In the above ultrasonic probe, it has been studied for disposing a transmitting circuit or a receiving circuit corresponding to the respective oscillators in a probe handle, bundling receiving signals by dividing the vibrates into groups of a plurality of sub arrays in the probe handle and not increasing the number of connecting signals to the ultrasonic diagnostic apparatus main body.

For example, in a two dimensional array probe including 3200 elements, when a group consists of 25 receiving elements, it is possible to control 3200 elements by 128 groups, and further possible to connect the main body having 128 channels. Further, in the groups, the electronic scan can be performed by minutely controlling a delay time corresponding to a direction of a receiving beam.

The delay time is controlled by a transmitting beam former provided in the probe handle and a high voltage pulse is generated from a transmitting circuit provided in every element. By using a serial bus between the device main body and the transmitting beam former, it is possible to transfer delay data and waveform data via a plurality of control lines.

However, in the ultrasonic probe that includes a transmitting and receiving circuit in the probe handle, heat generated due to a conversion loss of the ultrasonic oscillator and the heat generated due to the power consumption of the electronic circuit can not be avoided. Therefore, it is required to reduce the amount of the generated heat. Further, it is required to reduce the size and the weight of the probe handle so as to prevent the fatigue caused when grasping for a long time. Therefore, a small and low power consumption circuit is used as an electronic circuit in the probe, and the transmitting circuit is configured by a simple monopolar pulse driving circuit.

The clinical demand on harmonic imaging having a high resolution increases, and a method such as a pulse inversion imaging method is preferably used. The pulse inversion imaging method transmits twice a signal whose phase is shifted by 180 degrees and adds two echo signals on the basis of the twice transmission to extract only a harmonic component and then create an image.

However, since the general monopolar pulse driving circuit can not output a bipolar waveform, the pulse inversion imaging method can not used. Therefore, when the transmitting circuit is configured by the monopolar pulse driving circuit, a harmonic imaging method that uses a filtering method for removing a fundamental wave by the high pass filter is used. In the filtering method, the transmitting fundamental wave is uncontrollably removed, and the image quality is worse than that of the pulse inversion imaging method.

In JP-A-2004-89694, it is disclosed that an electrode opposite to an electrode of an ultrasonic oscillator to which a transmitting circuit is connected to a receiving circuit so that the pulse inversion imaging method can be used in the monopolar pulse driving circuit.

However, according to the configuration disclosed in JP-A-2004-89694, due to the difference in the characteristics of the P channel transistor, the N channel transistor and probe cable, the rising time and the falling time are different from each other. Therefore, the symmetrical property of the sinusoidal wave becomes deteriorated.

According to the related art, when the monopolar pulse driving is used, the bipolar waveform can not be output. Even when the bipolar waveform is output, the symmetrical property of the waveform is bad, and it is difficult to obtain a higher quality image than that of the pulse inversion imaging method.

BRIEF SUMMARY OF THE INVENTION

Accordingly, it is desired to transmit a bipolar waveform that is driven as a monopolar pulse, and has an excellent symmetrical property of the polarity.

An ultrasonic probe according to a first aspect of this invention includes ultrasonic oscillators each having first and second electrodes a first transmitting circuit that transmits an electrical signal to the first electrode and a second transmitting circuit that transmits an electrical signal to the second electrode.

An ultrasonic diagnostic apparatus according to a second aspect of this invention includes a ultrasonic probe that transmits an ultrasonic wave and receives an ultrasonic echo, and an image generating unit that generates an image on the basis of the ultrasonic echo received by the ultrasonic probe, wherein the ultrasonic probe includes ultrasonic oscillators each having first and second electrodes a first transmitting circuit that transmits an electrical signal to the first electrode and a second transmitting circuit that transmits an electrical signal to the second electrode.

An ultrasonic probe according to a third aspect of this invention includes a piezoelectric element that radiates an ultrasonic wave from an ultrasonic wave radiating surface a first electrode that is provided on an ultrasonic wave radiating surface of the piezoelectric element a second electrode that is provided on a surface opposite to the ultrasonic wave radiating surface of the piezoelectric element a switching unit that switches between the first electrode and the second electrode with respect to a first potential point and a second potential point a transmitting control unit that transmits ultrasonic waves having different phases plural times by switching the switching unit to drive the ultrasonic oscillators and a harmonic wave extracting unit that extracts a harmonic receiving signal component with respect to an ultrasonic fundamental wave at the time of transmitting the ultrasonic waves, on the basis of a plurality of ultrasonic echo signals obtained by transmitting ultrasonic waves plural times.

An ultrasonic diagnostic apparatus according to a fourth aspect of this invention includes an a piezoelectric element that radiates an ultrasonic wave from an ultrasonic wave radiating surface a first electrode that is provided on an ultrasonic wave radiating surface of the piezoelectric element a second electrode that is provided on a surface opposite to the ultrasonic wave radiating surface of the piezoelectric element a switching unit that switches between the first electrode and the second electrode with respect to a first potential point and a second potential point a transmitting control unit that transmits ultrasonic waves having different phases plural times by switching the switching unit to drive the ultrasonic oscillators and a harmonic wave extracting unit that extracts a harmonic receiving signal component with respect to an ultrasonic fundamental wave at the time of transmitting the ultrasonic waves, on the basis of a plurality of ultrasonic echo signals obtained by transmitting ultrasonic waves plural times.

BRIEF DESCRIPTION OF THE SEVERAL VIEWS OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Preferred embodiments of this invention will be described with reference to accompanying drawings.

First Embodiment

Figure 1:
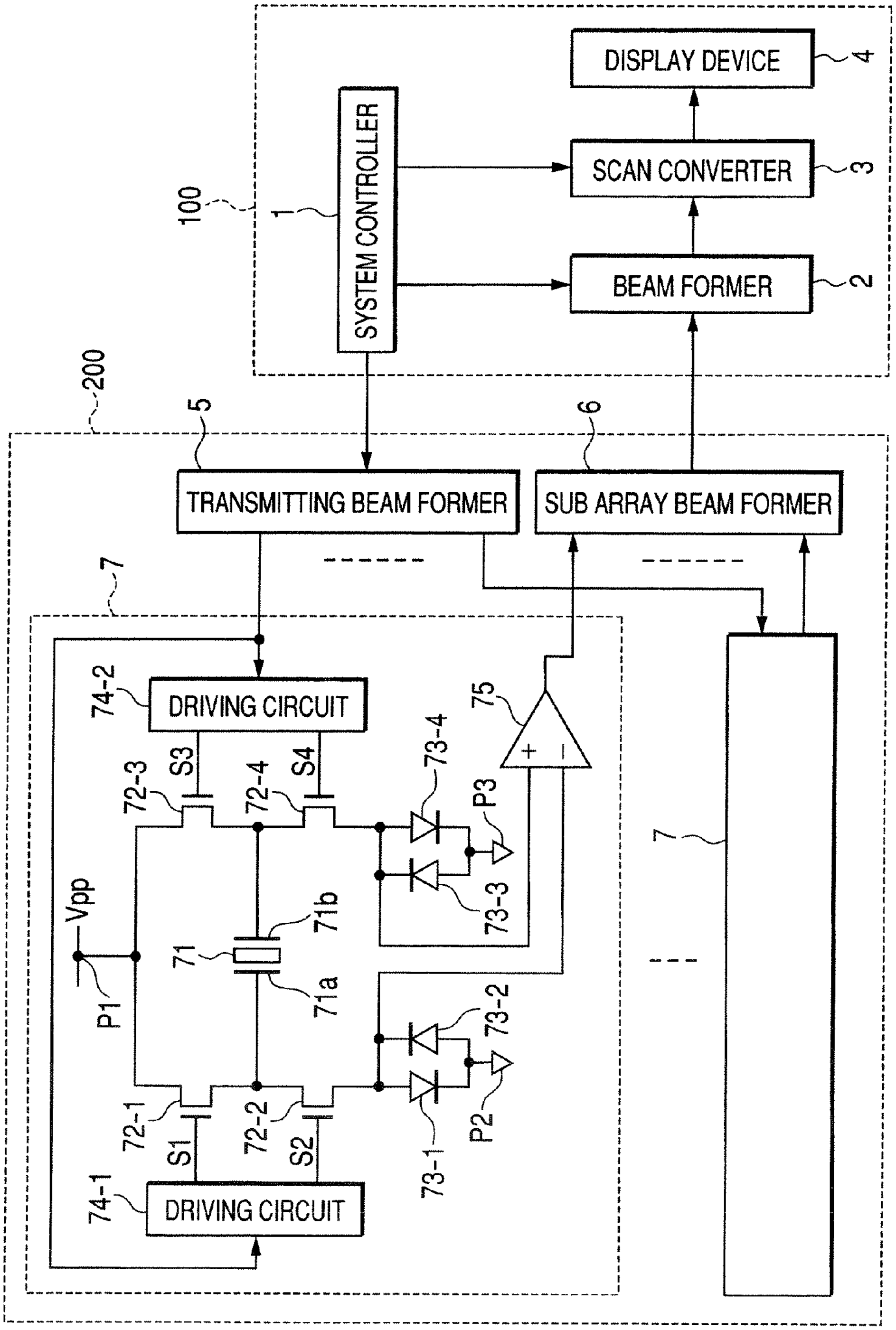
FIG. 1 is a diagram showing a configuration of an ultrasonic diagnostic apparatus according to a first embodiment of this invention.

FIG. 1 is a diagram showing a configuration of an ultrasonic diagnostic apparatus according to a first embodiment of this invention.

The ultrasonic diagnostic apparatus according to the first embodiment includes a main body 100 and an ultrasonic probe 200.

The main body 100 includes a system controller 1, a beam former 2, a scan converter 3, and a display device 4. The ultrasonic probe 200 includes a transmitting beam former 5, a sub array beam former 6, and a plurality of oscillator sets 7.

The system controller 1 transmits delay data and transmitting waveform data to the transmitting beam former 5. The transmitting beam former 5 controls the plurality of oscillator sets 7 so as to form a predetermined ultrasonic beam on the basis of the delay data and the transmitting waveform data.

The sub array beam former 6 minutely delays and adds echo signals output from the plurality of oscillator sets 7 in sub groups formed by dividing the plurality of oscillator sets 7 into a plurality of groups. The sub array beam former 6 transmits the added echo signal obtained for every sub group to the beam former 2. The beam former 2 delays and adds all added echo signal obtained for every sub group to obtain an echo signal relating to a predetermined receiving beam. Further, the beam former 2 extracts a harmonic wave component from the echo signal, when applying a pulse inversion imaging method. That is, the beam former 2 adds two echo signals on the basis of two transmission processes in which phases are shifted by 180 degrees and offset a fundamental wave to extract the harmonic wave component. The scan converter 3 converts the echo signal obtained by the beam former 2 into data suitable for displaying on the display device 4. The display device 4 displays an ultrasonic image on the basis of the data converted by the scan converter 3.

The plurality of oscillator sets 7 have the same configuration. That is, each of the oscillator sets 7 includes an ultrasonic oscillator 71, first to fourth transistors 72-1 to 72-4, driving circuits 74-1 and 74-2, first to fourth diodes 73-1 to 73-4, and a receiving amplifier 75.

Each of the ultrasonic oscillators 71 includes first and second electrodes 71*a* and 71*b*, and emits an ultrasonic wave according to the change in voltage applied between the two electrodes. The first electrode 71*a* is disposed on an ultrasonic wave radiating surface of the ultrasonic oscillator and the second electrode 71*b* is disposed on a surface opposite to ultrasonic wave radiating surface of the ultrasonic oscillator. The ultrasonic oscillators 71 provided in the plurality of oscillator sets 7 are arranged to form a 1.5 dimensional array or a two dimensional array.

The first transistor 72-1 is disposed between a potential point P1 whose voltage is Vpp and the first electrode 71*a*. The second transistor 72-2 is disposed between a potential point P2 that is a ground potential and the first electrode 71*a*. The third transistor 72-3 is disposed between the potential point P1 and the second electrode 71*b*. The fourth transistor 72-4 is disposed between a potential point P3 that is a ground potential and the second electrode 71*b*. Gates of the first and second transistors 72-1 and 72-2 are connected to the driving circuit 74-1. Gates of the third and fourth transistors 72-3 and 72-4 are connected to the driving circuit 74-2. All of the first to fourth transistors 72-1 to 72-4 are formed of the same elements. In detail, the first to fourth transistors 72-1 to 72-4 have the same characteristics. In this embodiment, the same type of P channel transistors may be used.

Both the first and second diodes 73-1 and 73-2 are disposed between the potential point P2 and the second transistor 72-2. The first and second diodes 73-1 and 73-2 are reversely parallel to each other. Both the third and fourth diodes 73-3 and 73-4 are disposed between the potential point P3 and the fourth transistor 72-4. The third and fourth diodes 73-3 and 73-4 are reversely parallel to each other.

A control signal output from the transmitting beam former 5 is input to the driving circuits 74-1 and 74-2. The driving circuit 74-1 transmits driving signals S1 and S2 to the first and second diodes 73-1 and 73-2 on the basis of the control signal. The driving circuit 74-2 transmits driving signals S3 and S4 to the third and fourth diodes 73-3 and 73-4 on the basis of the control signal.

The receiving amplifier 75 is a differential amplifier circuit and includes two input terminals. One of the input terminals is connected to the first electrode 71*a* via the second transistor 72-2. The other input terminal is connected to the second electrode 71*b* via the fourth transistor 72-4. That is, the echo signal received by the ultrasonic oscillator 71 is input to the receiving amplifier 75 via the second and fourth transistors 72-2 and 72-4. The receiving amplifier 75 amplifies the echo signal and then transmits to the sub array beam former 6.

Next, the operation of the ultrasonic diagnostic apparatus as constructed above will be described. The difference between the operations of this ultrasonic diagnostic apparatus and the conventional one is in the driving operation of the ultrasonic oscillator 71 when transmitting and receiving the ultrasonic wave. Hereinafter, the driving operation will be described and the description of the other operation will be omitted.

Figure 2:
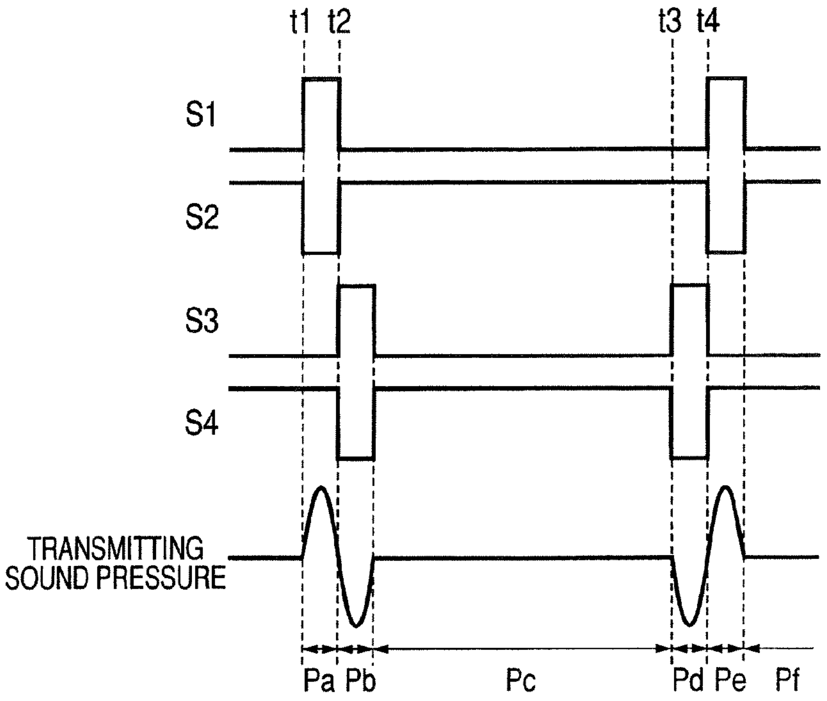
FIG. 2 is a timing chart showing a sequence that transmits waveforms that are inverted at 180 degrees in first and second transmitting processes in the first embodiment.

FIG. 2 is a timing chart showing a sequence that transmits waveforms that are inverted at 180 degrees in first and second transmitting processes.

Figure 3:
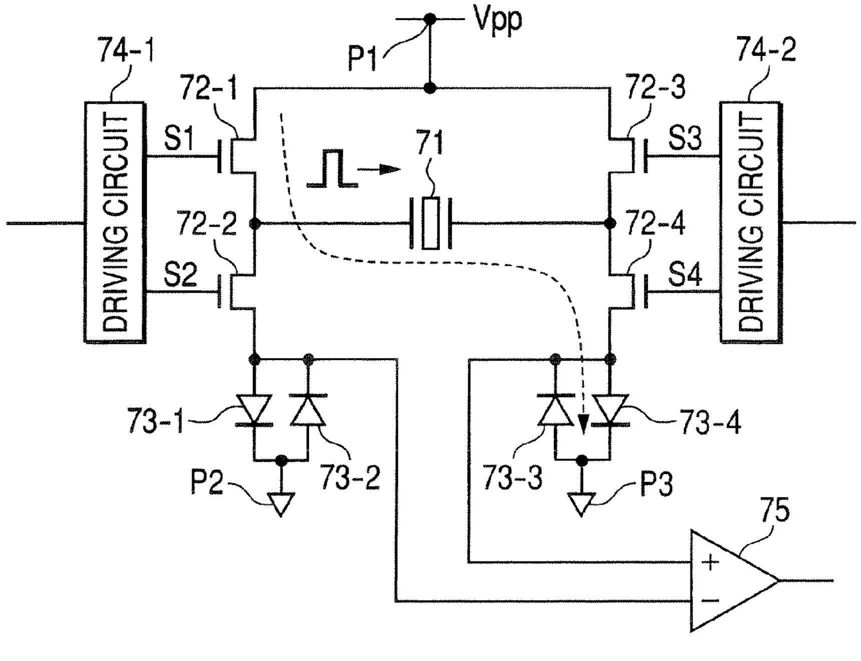
FIG. 3 is a view showing a path of a pulse current in the oscillator set shown in FIG. 1.

In a period Pa for a time T from a timing point t1 when the first transmitting process starts, the driving circuits 74-1 and 74-2 make the driving signals S1 and S4 be high levels and the driving signals S2 and S3 be low levels. The time T corresponds to a ½ wavelength. For example, when the frequency of the ultrasonic oscillator is 2 MHz, the time T is 250 nsec. The first transistor 72-1 and the fourth transistor 72-4 are turned on. In this case, as shown in FIG. 3, a pulse current flows from the potential point P1 to the potential point P3 via the first transistor 72-1, the ultrasonic oscillator 71, the fourth transistor 72-4, and the fourth diode 73-4.

Figure 4:
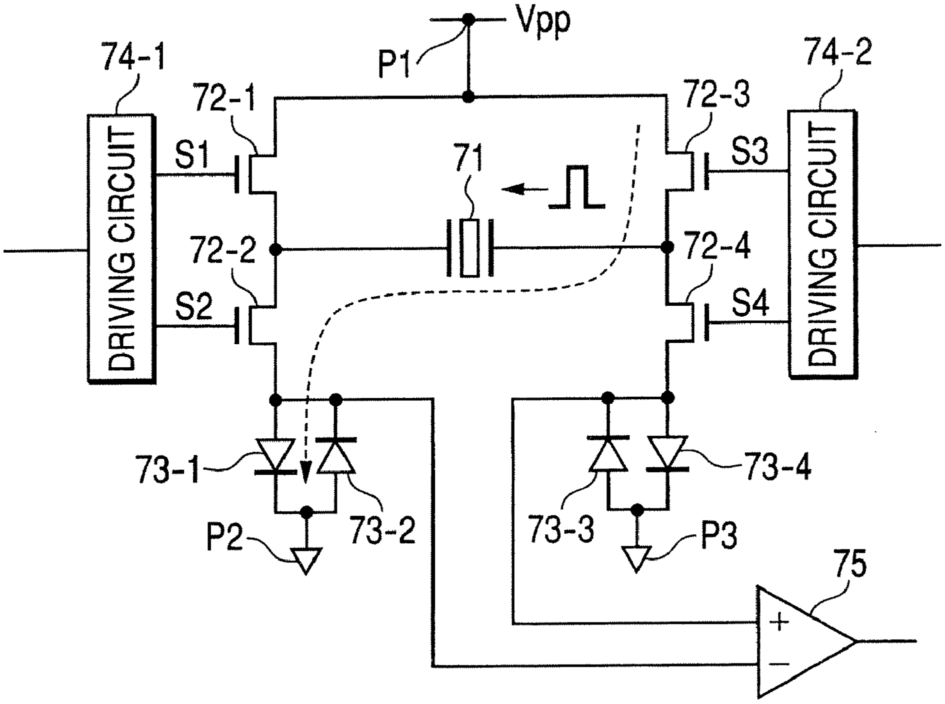
FIG. 4 is a view showing a path of a pulse current in the oscillator set shown in FIG. 1.

In a period Pb for a time T from a timing point t2 that the period Pa is terminated, the driving circuits 74-1 and 74-2 make the driving signals S2 and S3 be high levels and the driving signals S1 and S4 be low levels. The second transistor 72-2 and the third transistor 72-3 are turned on. In this case, as shown in FIG. 4, a pulse current flows from the potential point PI to the potential point P2 via the third transistor 72-3, the ultrasonic oscillator 71, the second transistor 72-2, and the first diode 73-1.

As described above, during the period Pa and Pb, even though the same voltage is applied to the ultrasonic oscillator 71, the directions of the pulse currents are reversed to each other. Therefore, as seen from the waveform of the transmitting sound pressure shown in FIG. 2, the polarities of the sound output are opposite to each other in the periods Pa and Pb.

Figure 5:
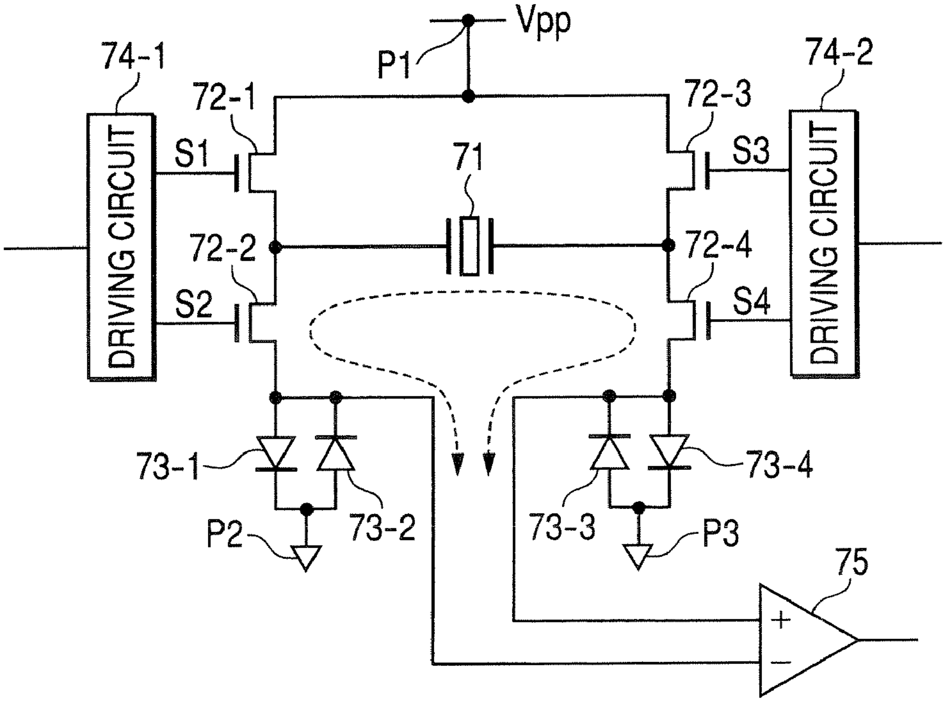
FIG. 5 is a view showing a path in the oscillator set shown in FIG. 1 through which an echo signal flows.

In periods Pc and Pf when the sound is not output, the driving circuits 74-1 and 74-2 make the driving signals S2 and S4 be high levels and the driving signals S1 and S3 be low levels. The second transistor 72-2 and the fourth transistor 72-4 are turned on. In this case, as shown in FIG. 5, an echo signal generated from an ultrasonic echo received by the ultrasonic oscillator 71 is input to the receiving amplifier 75 via the second transistor 72-2 or the fourth transistor 72-4. The first to fourth diodes 73-1 to 73-4 input the echo signal from the ultrasonic oscillator 71 to the receiving amplifier 75 in a high impedance mode. That is, the first to fourth diodes 73-1 to 73-4 serve as T/R switches.

In a period Pd for a time T from a timing point t3 when the second transmitting process starts, the driving circuits 74-1 and 74-2 make the driving signals S2 and S3 be high levels and the driving signals S1 and S4 be low levels. Therefore, the state in the period Pd is the same as in the period Pb.

In a period Pe for a time T from a timing point t4 that the period Pd is terminated, the driving circuits 74-1 and 74-2 make the driving signals S1 and S4 be high levels and the driving signals S2 and S3 be low levels. Therefore, the state in the period Pe is the same as in the period Pa. Further, as seen from the waveform of the transmitting sound pressure shown in FIG. 2, the phases of the sound output are inverted at 180 degrees to each other in the periods Pa and Pb and the periods Pd and Pe.

According to the first embodiment, since all of the driving signals S1 to S4 output from the driving circuits 74-1 and 74-2 are monopolar pulses, the sound output may have a bipolar waveform shown in FIG. 2, and the phase of the bipolar waveform may be inverted at 180 degrees. Therefore, even when transmitting any of waveforms whose phase are shifted by 180 degrees from each other, since the transistors that form a rising curve of the waveform have the same characteristics, the symmetrical property of the both waveforms is excellent.

In the imaging method that performs harmonic imaging by two transmitting and receiving processes, the symmetrical property of the transmitting waveform that is inverted at 180 degrees has a large influence on the image quality. Therefore, according to the ultrasonic diagnostic apparatus of the first embodiment, it is possible to improve the image quality at the time of the harmonic imaging.

For example, in a monopolar driving circuit according to the related art, in order to output the transmitting voltage of 100 Vp-p, the required power supply voltage is 100 V. However, in the first embodiment, the required power supply voltage is only 50 V. Further, in order to output the transmitting voltage of 100 Vp-p also from the bipolar driving circuits, two types of voltage supplies of +50 V and −50 V are required in the related art. But, in this embodiment, only one voltage supply of 50 V is sufficient. That is, according to the first embodiment, the voltage output of the power supply circuit is preferably half of the peak value of the transmitting voltage.

Further, when the transmitting voltage is 100 Vp-p, a withstanding voltage of transistors of 100 V or more is required to form the monopolar driving circuit according to the related art. But, according to the first embodiment, withstanding voltages of the first to fourth transistors 72-1 to 72-4 are preferably 50 V. That is, according to the first embodiment, the withstanding voltages of the first to fourth transistors 72-1 to 72-4 are preferably half of the peak value of the transmitting voltage. When the power supply voltage is half of the peak value, the current is half of the peak value. Therefore, it is possible to use cheap and small elements as the first to fourth transistors 72-1 to 72-4.

Figure 6:
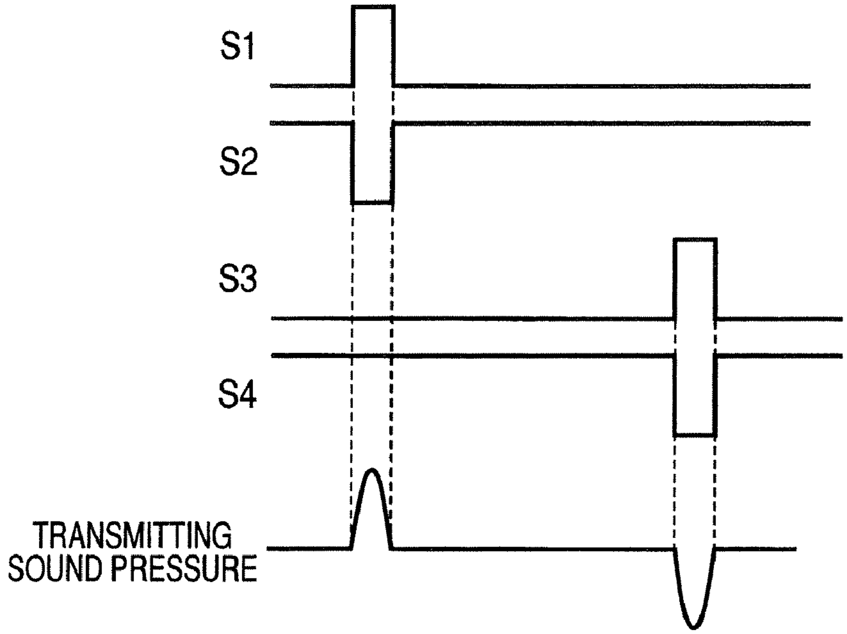
FIG. 6 is a timing chart showing a modification of a sequence transmitting a wave form that is inverted at 180 degrees in first and second transmitting processes in the first embodiment.

Referring to FIG. 6, when the driving circuits 74-1 and 74-2 make the driving signals S1 and S4 be high levels in the first transmitting process, and make only the driving signals S2 and S3 be high levels in the second transmitting process, a broadband pulse having a positive wave in the first transmitting process and a negative wave in the second transmitting process can be inverted at 180 degrees to be transmitted.

Figure 7:
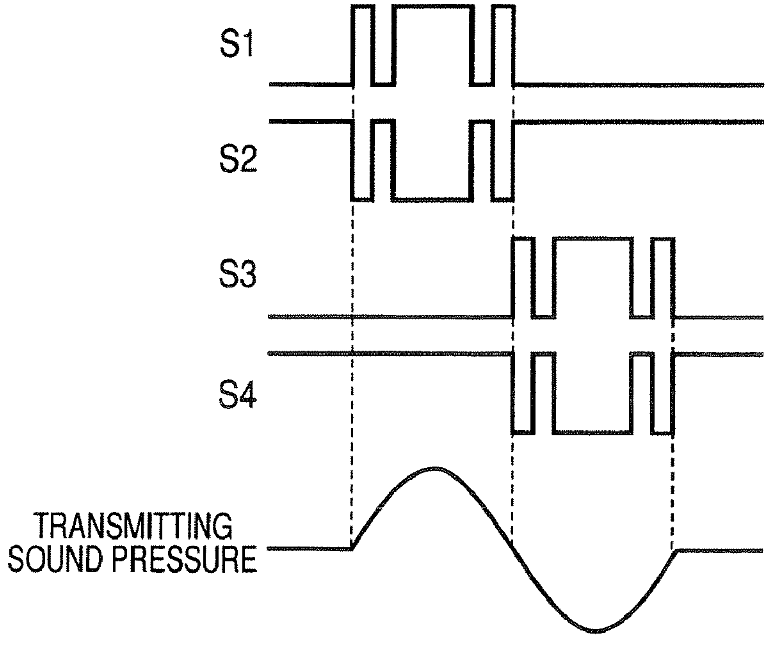
FIG. 7 is a timing chart showing a modification of a sequence transmitting a wave form that is inverted at 180 degrees in first and second transmitting processes in the first embodiment.

Further, referring to FIG. 7, when the driving circuits 74-1 and 74-2 generate pulse width modulated pulses as driving signals, it is possible to transmit a limited harmonic wave and assign functions to every transmitting channel to wait the transmission.

Second Embodiment

Figure 8:
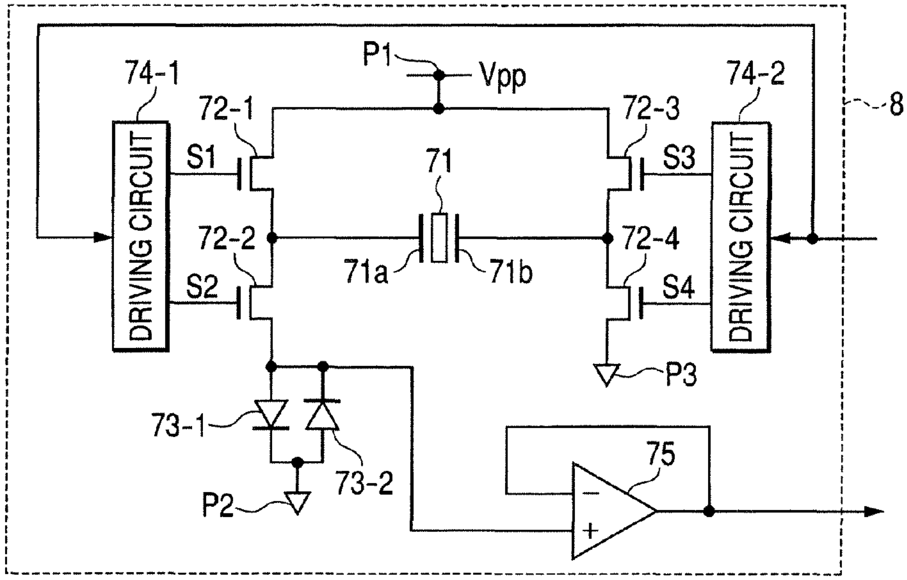
FIG. 8 is a diagram showing a configuration of an ultrasonic diagnostic apparatus according to a second embodiment of this invention.

FIG. 8 is a diagram showing a configuration of an ultrasonic diagnostic apparatus according to a second embodiment of this invention. In FIG. 8, the same elements as elements of FIG. 1 are not shown or denoted by the same reference numerals. Further, the detailed description thereof will be omitted. The ultrasonic diagnostic apparatus according to the second embodiment is different from that of the first embodiment in that oscillator sets 8 are provided as substitute for the oscillator sets 7. Therefore, in FIG. 8, the configuration of only one oscillator set 8 is shown.

Each of the oscillator sets 8 includes an ultrasonic oscillator 71, first to fourth transistors 72-1 to 72-4, driving circuits 74-1 and 74-2, first and second diodes 73-1 and 73-2, and a receiving amplifier 75.

That is, in the oscillator set 8, the third and fourth diodes 73-3 and 73-4 of the oscillator set 7 are omitted, and the fourth diode 72-4 is directly connected to a potential point P3.

Therefore, an output of the receiving amplifier 75 is fed back to an inverting input terminal of the receiving amplifier 75, and a non-inverting input terminal of the receiving amplifier 75 is connected to the first electrode 71*a* via the second transistor 72-2.

Even though the oscillator sets 7 are substituted by the oscillator sets 8 having the above configuration, the same effect as the first embodiment can be obtained.

Detection of the receiving echo can be realized also by one side input to the receiving amplifier 75 as shown in FIG. 8.

Third Embodiment

Figure 9:
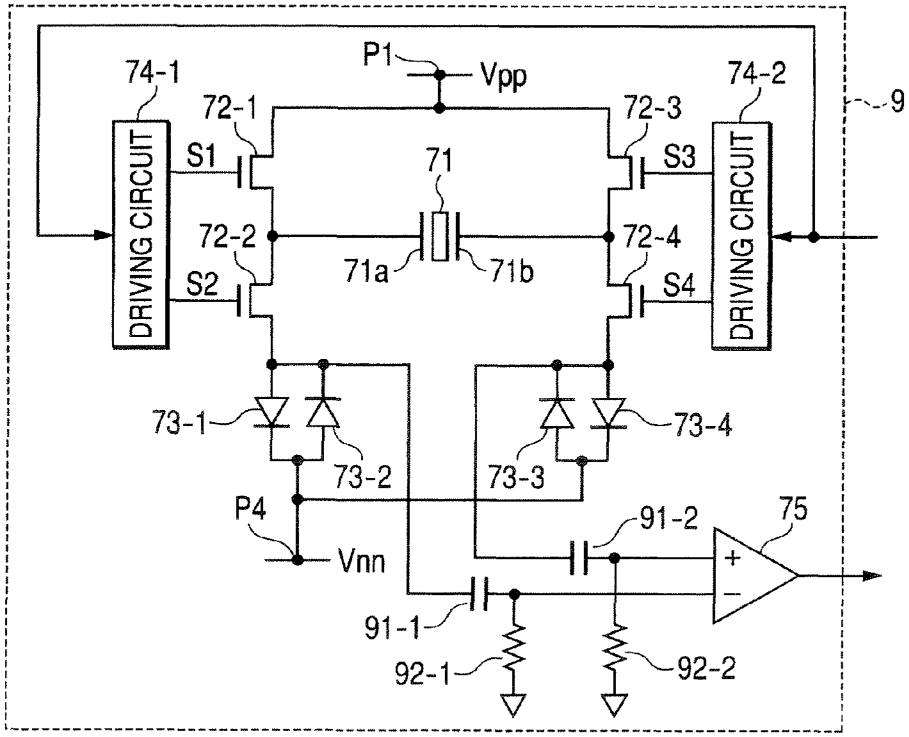
FIG. 9 is a diagram showing a configuration of an ultrasonic diagnostic apparatus according to a third embodiment of this invention.

FIG. 9 is a diagram showing a configuration of an ultrasonic diagnostic apparatus according to a third embodiment of this invention. In FIG. 9, the same elements as elements of FIG. 1 are not shown or denoted by the same reference numerals. Further, the detailed description thereof will be omitted. The ultrasonic diagnostic apparatus according to the third embodiment is different from that of the first embodiment in that oscillator sets 9 are provided as substitute for the oscillator sets 7. Therefore, in FIG. 9, the configuration of only one oscillator set 9 is shown.

Each of the oscillator sets 9 includes an ultrasonic oscillator 71, first to fourth transistors 72-1 to 72-4, driving circuits 74-1 and 74-2, first to fourth diodes 73-1 to 73-4, a receiving amplifier 75, capacitors 91-1 and 91-2, and resistors 92-1 and 92-2.

That is, in the oscillator set 9, the capacitors 91-1 and 91-2, and the resistors 92-1 and 92-2 are added to the configuration of the oscillator set 7. The capacitors 91-1 and 91-2 are disposed between the second and fourth diodes 72-2 and 72-4 and two input terminals of the receiving amplifier 75, respectively. The resistors 92-1 and 92-2 are disposed between the two input terminals of the receiving amplifier 75 and a ground potential point.

In the oscillator set 9, the first electrode 71*a* is connected to a potential point P4 whose voltage is Vnn via the second transistor 72-2, the first and second diode 73-1 and 73-2. The second electrode 71*a* is connected to a potential point P4 via the fourth transistor 72-4, the third and fourth diode 73-3 and 73-4. The voltage Vnn has a value different from that of the voltage Vpp.

With this configuration, excepting that two types of voltage supplies are required, it is possible to obtain the same effect as the first embodiment.

Further, the echo signal is sent to the receiving amplifier 75 via an alternate current coupling configured by the capacitor 91-1 and the resistor 92-1 or the capacitor 91-2 and the resistor 92-2.

Fourth Embodiment

Figure 10:
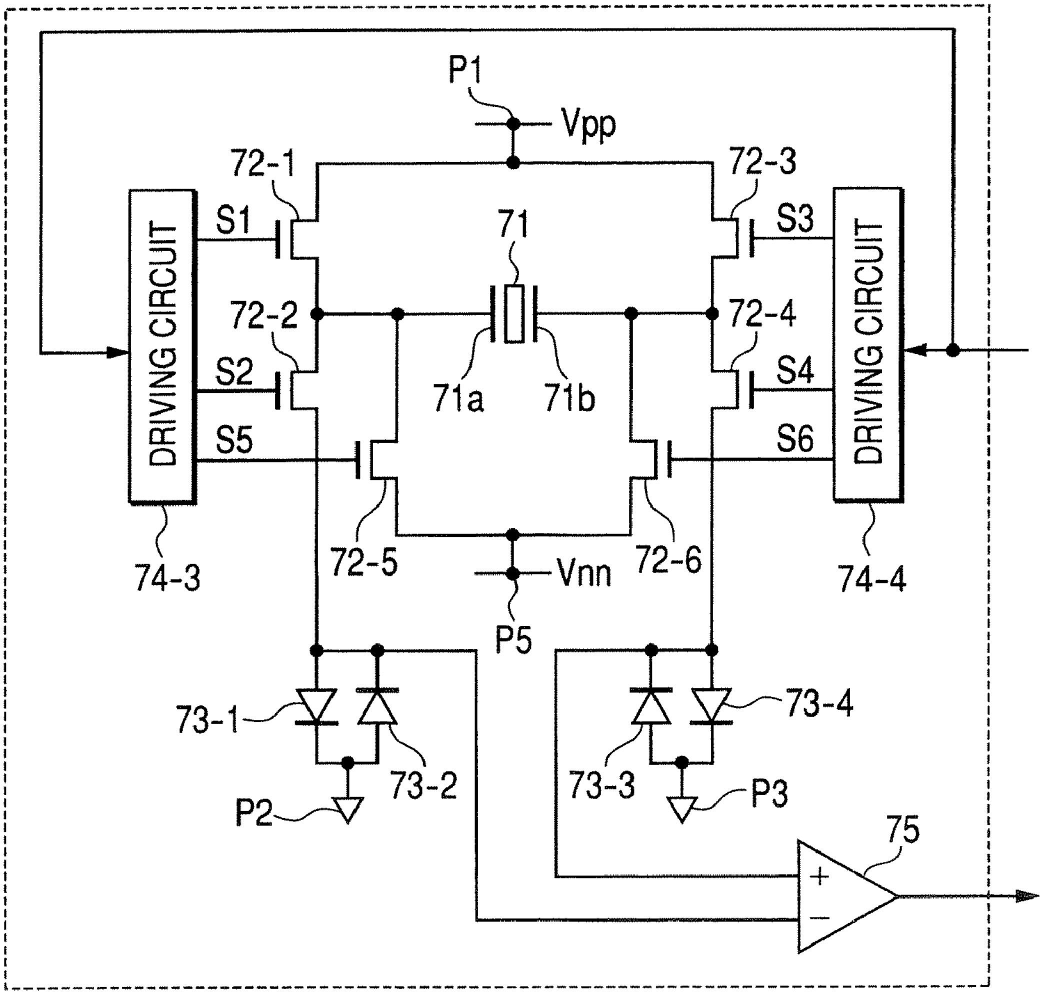
FIG. 10 is a diagram showing a configuration of an ultrasonic diagnostic apparatus according to a fourth embodiment of this invention.

FIG. 10 is a diagram showing a configuration of an ultrasonic diagnostic apparatus according to a fourth embodiment of this invention. In FIG. 10, the same elements as elements of FIG. 1 are not shown or denoted by the same reference numerals. Further, the detailed description thereof will be omitted. The ultrasonic diagnostic apparatus according to the fourth embodiment is different from that of the first embodiment in that oscillator sets 10 are provided as substitute for the oscillator sets 7. Therefore, in FIG. 10, the configuration of only one oscillator set 10 is shown.

Each of the oscillator sets 10 includes an ultrasonic oscillator 71, first to sixth transistors 72-1 to 72-6, first to fourth diodes 73-1 to 73-4, driving circuits 74-3 and 74-4, and a receiving amplifier 75.

That is, in the oscillator set 10, the fifth and sixth transistors 72-5 and 72-6 are added to the configuration of the oscillator set 7, and the driving circuits 74-1 and 74-2 are substituted by the driving circuits 74-3 and 74-4.

The fifth transistor 72-5 is disposed between a potential point P5 whose voltage is Vnn and the first electrode 71*a*. The sixth transistor 72-6 is disposed between the potential point P5 and the second electrode 71*b*. Gates of the first, second and fifth transistors 72-1, 72-2, and 72-5 are connected to the driving circuit 74-3. Gates of the third, fourth and sixth transistors 72-3, 72-4, and 72-6 are connected to the driving circuit 74-4. The elements of the first to fourth transistors 72-1 to 72-4 are the same as those of the fifth and sixth transistors 72-5 and 72-6. The polarity of the voltage Vnn is opposite to the polarity of the voltage Vpp.

A control signal output from a transmitting beam former 5 is input to the driving circuit 74-3 and 74-4. The driving circuit 74-3 transmits driving signals S1, S2 and S5 to the first, second and fifth diodes 73-1, 73-2, and 73-5 on the basis of the control signal. The driving circuit 74-4 transmits driving signals S3, S4, and S6 to the third, fourth, and sixth diodes 73-3, 73-4, and 73-6 on the basis of the control signal.

Next, the operation of the ultrasonic diagnostic apparatus as constructed above will be described. The difference between the operations of this ultrasonic diagnostic apparatus and the conventional one is the driving operation of the ultrasonic oscillator 71 when transmitting the ultrasonic wave. Hereinafter, the driving operation will be described and the description of the other operation will be omitted.

Figure 11:
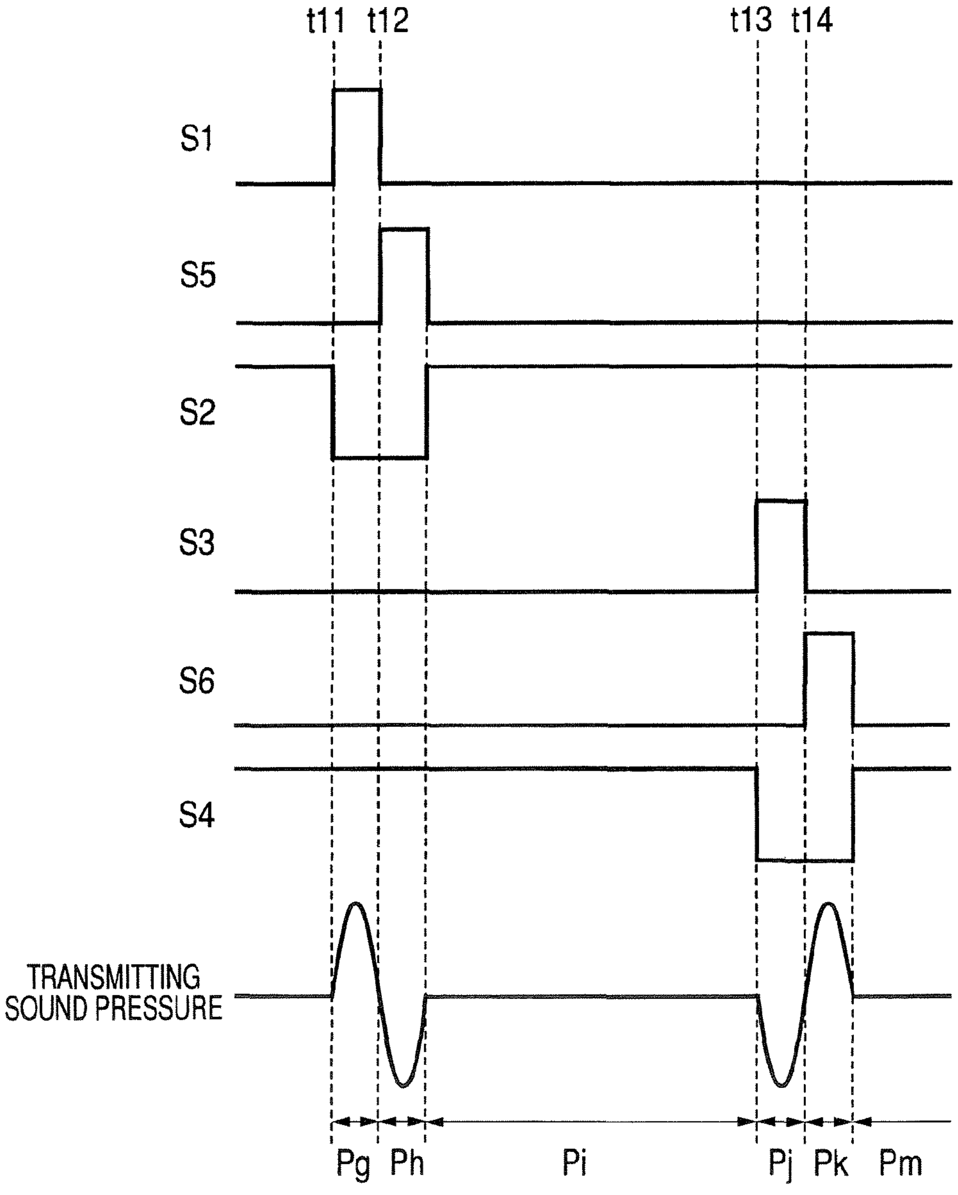
FIG. 11 is a timing chart showing a modification of a sequence transmitting a wave form that is inverted at 180 degrees in first and second transmitting processes in the fourth embodiment.

FIG. 11 is a timing chart showing a sequence that transmits waveforms that are inverted at 180 degrees in first and second transmitting processes.

In a period Pg for a time T from a timing point t11 when the first transmitting process starts, the driving circuits 74-3 and 74-4 make the driving signals S1 and S4 be high levels and the other driving signals S2, S3, S5, and S6 be low levels. Therefore, the first transistor 72-1 and the fourth transistor 72-4 are turned on. In this case, a pulse current flows from the potential point P1 to the potential point P3 via the first transistor 72-1, the ultrasonic oscillator 71, the fourth transistor 72-4, and the fourth diode 73-4, which is same as FIG. 3.

In a period Ph for a time T from a timing point t12 that the period Pg is terminated, the driving circuits 74-3 and 74-4 make the driving signals S4 and S5 be high levels and the other driving signals S1, S2, S3, and S6 be low levels. The fourth transistor 72-4 and the fifth transistor 72-5 are turned on. In this case, a pulse current flows from the potential point P5 to the potential point P3 via the fifth transistor 72-5, the ultrasonic oscillator 71, the fourth transistor 72-4, and the fourth diode 73-4.

As described above, during the periods Pg and Ph, even though the directions of the pulse currents in the ultrasonic oscillator 71 are equal to each other, the polarities of voltages that are applied to the ultrasonic oscillator 71 are opposite to each other. Therefore, as seen from the waveform of the transmitting sound pressure shown in FIG. 11, the polarities of the sound output are opposite to each other in the periods Pg and Ph.

In periods Pi and Pm when the sound is not output, the driving circuits 74-3 and 74-4 make the driving signals S2 and S4 be high levels and the other driving signals S1, S3, 5, and S6 be low levels. The second transistor 72-2 and the fourth transistor 72-4 are turned on, which is the same as in FIG. 5.

In a period Pj for a time T from a timing point t13 when the second transmitting process starts, the driving circuits 74-3 and 74-4 make the driving signals S2 and S3 be high levels and the other driving signals S1, S4, S5, and S6 be low levels. The second transistor 72-2 and the third transistor 72-3 are turned on. In this case, a pulse current flows from the potential point P1 to the potential point P2 via the third transistor 72-3, the ultrasonic oscillator 71, the second transistor 72-2, and the first diode 73-1, which is the same as FIG. 4.

In a period Pk for a time T from a timing point t14 that the period Pj is terminated, the driving circuits 74-3 and 74-4 make the driving signals S2 and S6 be high levels and the other driving signals S1, S3, S4, and S5 be low levels. Therefore, the second transistor 72-2 and the sixth transistor 72-6 are turned on. In this case, a pulse current flows from the potential point P5 to the potential point P2 via the sixth transistor 72-6, the ultrasonic oscillator 71, the second transistor 72-2, and the first diode 73-1.

As described above, during the periods Pj and Pk, even though the directions of the pulse currents in the ultrasonic oscillator 71 are equal to each other, the polarities of voltages that are applied to the ultrasonic oscillator 71 are opposite to each other. Therefore, as seen from the waveform of the transmitting sound pressure shown in FIG. 11, the polarities of the sound output are opposite to each other in the periods Pj and Pk.

Therefore, during the periods Pj and Pk, the directions of the pulse currents are reversed to those of the periods Pg and Ph and the changed amount of applied voltage is same as that of the periods Pg and Ph. As a result, as seen from the waveform of the transmitting sound pressure shown in FIG. 11, the phases of the sound output are inverted at 180 degrees to each other in the periods Pg and Ph and the periods Pj and Pk.

Therefore, according to the fourth embodiment, since all of the driving signals S1 to S6 output from the driving circuits 74-3 and 74-4 are monopolar pulses, the sound output may have a bipolar waveform shown in FIG. 11, and the phase of the bipolar waveform may be inverted at 180 degrees. Therefore, even when transmitting any of waveforms whose phases are shifted by 180 degrees from each other, since the transistors that form a rising curve of the waveform have the same characteristics, the symmetrical property of the both waveforms is excellent.

The following modifications with respect to the above embodiments can be made.

Some of circuits mounted in an ultrasonic probe 200 can be provided in the main body 100. For example, it is possible to connect signals output from both poles of the ultrasonic oscillator 71 to the main body, and to provide circuits other than the ultrasonic oscillator 71 in the main body 100.

The first and third transistors 72-1 and 72-3 may be connected to different potential points whose voltage is Vpp. The fifth and sixth transistors 72-5 and 72-6 may be connected to different potential points whose voltage is Vnn.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic probe comprising:

ultrasonic oscillators each having a first electrode disposed on an ultrasonic wave radiating surface of the ultrasonic oscillator and a second electrode disposed on a surface opposite to the ultrasonic wave radiating surface;

a first transmitting circuit that transmits a first electrical signal to the first electrode; and a second transmitting circuit that transmits a second electrical signal to the second electrode, wherein the first transmitting circuit includes a first switching element connected between a first power supply and the first electrode and a second switching element connected between a second power supply or a ground potential point and the first electrode, and the second transmitting circuit includes a third switching element connected between the first power supply and the second electrode and a fourth switching element connected between a second power supply or a ground potential point and the second electrode.

2. The ultrasonic probe according to claim 1, further comprising:

a receiving circuit whose input terminal is connected to the first or second electrode via any one of the first and second switching elements or any one of the third and fourth switching elements.

3. The ultrasonic probe according to claim 1, further comprising:

a differential receiving circuit whose two input terminals are connected to the first and second electrodes via one of the first and second switching elements and one of the third and fourth switching elements.

4. An ultrasonic probe comprising:

ultrasonic oscillators each having a first electrode disposed on an ultrasonic wave radiating surface of the ultrasonic oscillator and a second electrode disposed on a surface opposite to the ultrasonic wave radiating surface;

a first transmitting circuit that transmits a first electrical signal to the first electrode; and a second transmitting circuit that transmits a second electrical signal to the second electrode, wherein a plurality of the ultrasonic oscillators are arranged in a two dimensional array shape and a plurality of the first transmitting circuits and a plurality of the second transmitting circuits are provided so as to correspond to each of the ultrasonic oscillators.

5. An ultrasonic diagnostic apparatus, comprising:

a ultrasonic probe that transmits an ultrasonic wave and receives an ultrasonic echo, and an image generating unit that generates an image on the basis of the ultrasonic echo received by the ultrasonic probe, wherein the ultrasonic probe includes:

ultrasonic oscillators each having a first electrode disposed on an ultrasonic wave radiating surface of the ultrasonic oscillator and a second electrode disposed on a surface opposite to the ultrasonic wave radiating surface;

a first transmitting circuit that transmits an electrical signal to the first electrode; and a second transmitting circuit that transmits an electrical signal to the second electrode.

6. The ultrasonic diagnostic apparatus according to claim 5, wherein the first transmitting circuit includes a first switching element connected between a first power supply and the first electrode and a second switching element connected between a second power supply or a ground potential point and the first electrode, and the second transmitting circuit includes a third switching element connected between the first power supply and the second electrode and a fourth switching element connected between a second power supply or a ground potential point and the second electrode.

7. The ultrasonic diagnostic apparatus according to claim 6, further comprising:

a driving circuit that turns on the first switching element and the third switching element during a transmitting period of the first transmitting circuit, and turns on the second switching element and the fourth switching element during a transmitting period of the second transmitting circuit.

8. The ultrasonic diagnostic apparatus according to claim 5, further comprising:

a transmitting control unit that transmits ultrasonic waves having different phases plural times by switching between the first transmitting circuit and the second transmitting circuit to drive the ultrasonic oscillators, and a harmonic wave extracting unit that extracts a harmonic receiving signal component with respect to an ultrasonic fundamental wave at the time of transmitting ultrasonic wave, on the basis of a plurality of ultrasonic echo signals obtained by transmitting ultrasonic waves plural times.

9. The ultrasonic diagnostic apparatus according to claim 5, wherein a plurality of the ultrasonic oscillators are arranged in a two dimensional array shape and a plurality of the first transmitting circuits and a plurality of the second transmitting circuits are provided so as to correspond to each of the ultrasonic oscillator.

10. An ultrasonic probe, comprising:

a piezoelectric element that radiates an ultrasonic wave from an ultrasonic wave radiating surface;

a first electrode that is provided on an ultrasonic wave radiating surface of the piezoelectric element;

a second electrode that is provided on a surface opposite to the ultrasonic wave radiating surface of the piezoelectric element;

a switching unit that switches between the first electrode and the second electrode with respect to a first potential point and a second potential point;

a transmitting control unit that transmits ultrasonic waves having different phases plural times by switching the switching unit to drive the ultrasonic oscillators; and a harmonic wave extracting unit that extracts a harmonic receiving signal component with respect to an ultrasonic fundamental wave at the time of transmitting the ultrasonic waves, on the basis of a plurality of ultrasonic echo signals obtained by transmitting ultrasonic waves plural times.

11. An ultrasonic diagnostic apparatus, comprising:

a piezoelectric element that radiates an ultrasonic wave from an ultrasonic wave radiating surface;

a first electrode that is provided on an ultrasonic wave radiating surface of the piezoelectric element;

a second electrode that is provided on a surface opposite to the ultrasonic wave radiating surface of the piezoelectric element;

a switching unit that switches between the first electrode and the second electrode with respect to a first potential point and a second potential point;

a transmitting control unit that transmits ultrasonic waves having different phases plural times by switching the switching unit to drive the ultrasonic oscillators; and a harmonic wave extracting unit that extracts a harmonic receiving signal component with respect to an ultrasonic fundamental wave at the time of transmitting the ultrasonic waves, on the basis of a plurality of ultrasonic echo signals obtained by transmitting ultrasonic waves plural times.

* * * * *